United States Patent [19]

Awano

[11] Patent Number: 4,914,489

[45] Date of Patent: Apr. 3, 1990

[54] CONSTANT CURRENT SEMICONDUCTOR DEVICE

[75] Inventor: Yuji Awano, Tokyo, Japan

[73] Assignee: Fujitsu Limited, Kawasaki, Japan

[21] Appl. No.: 397,339

[22] Filed: Aug. 24, 1989

Related U.S. Application Data

[63] Continuation of Ser. No. 134,996, Dec. 18, 1987, abandoned.

[30] Foreign Application Priority Data

Dec. 20, 1986 [JP] Japan .................................. 61-302865

[51] Int. Cl.$^4$ .................. H01L 29/61; H01L 29/205; H01L 29/80
[52] U.S. Cl. ......................................... 357/16; 357/22; 357/3
[58] Field of Search ............................... 357/3, 16, 22

[56] References Cited

U.S. PATENT DOCUMENTS

| | | | |
|---|---|---|---|
| 4,017,332 | 4/1977 | James | 357/16 |
| 4,353,081 | 10/1982 | Allyn et al. | 357/16 |
| 4,714,948 | 12/1987 | Minura et al. | 357/16 |

FOREIGN PATENT DOCUMENTS 0272885 6/1988 European Pat. Off. .

OTHER PUBLICATIONS

Gunn, "The Gunn Effect", International Science and Technology, Oct. 1965, pp. 43-54.

Soviet Technical Physics Letters, vol. 9, No. 4, Apr. 1983, "Dynamic Negative Differential Conductivity of Selective-Doping Heterostructures", by A. A. Kal'fa, pp. 199-200.

Solid-State Electronics, vol. 23, 1980, "A Study of the Conduction Properties of Rectifying nGaAs-n(Ga,Al)As Heterojunction", by Chandra et al., pp. 599-603.

Zuleeg, "Possible Ballistic Effects in GaAs Current Limiters", IEEE, EDL-1, No. 11, p. 234, 1980.

K. Tomizawa et al., "Monte Carlo Simulation of GaAs Submicron n+-n-n+ Diode with GaAlAs Heterojunction Cathode", Electronics Letters, Dec. 9th, 1982, vol. 18, No. 25126, pp. 1067-1069.

Journal of Vacuum Science & Technology, B, vol. 3, No. 4, Jul.-Aug. 1985, "N+InGaAs/nGaAs Heterojunction Schottky Diodes with Low Barriers Controlled by Hand Offset and Doping Level", by A. W. Kleinsasser et al., pp. 1274-1279, (American Vacuum Society, Woodbury, New York, U.S.).

Soviet Physics Semiconductors, vol. 19, No. 12, Dec. 1985, "Negative Differential Conductance of Selectively Doped In0.53Ga0.47As-InP Heterostructure", by A. V. Garmatin et al., pp. 1375-1376, (American Institute of Physics, Woodbury, New York, U.S.).

Primary Examiner—Eugene R. Laroche
Assistant Examiner—Michael B. Shingleton
Attorney, Agent, or Firm—Staas & Halsey

[57] ABSTRACT

A constant current semiconductor device includes a first semiconductor active layer and a second semiconductor active layer which is of a different material from the first active layer and forms a heterojunction together with the first active layer. An intervalley energy difference $\Delta E_1$ of the first active layer which is a difference in energy between bottoms of L and Γ valleys of the conduction band of the first active layer, is different from an intervalley energy difference $\Delta E_2$ of the second active layer which is a difference in energy between bottoms of L and Γ valleys of the conduction band of the second active layer. A current saturating voltage at which a current passing through the semiconductor devce is saturated, is set so as to be equal to or greater then $\Delta E_2/e$, where e is an absolute value of charge of an electron.

15 Claims, 9 Drawing Sheets

FIG.7A
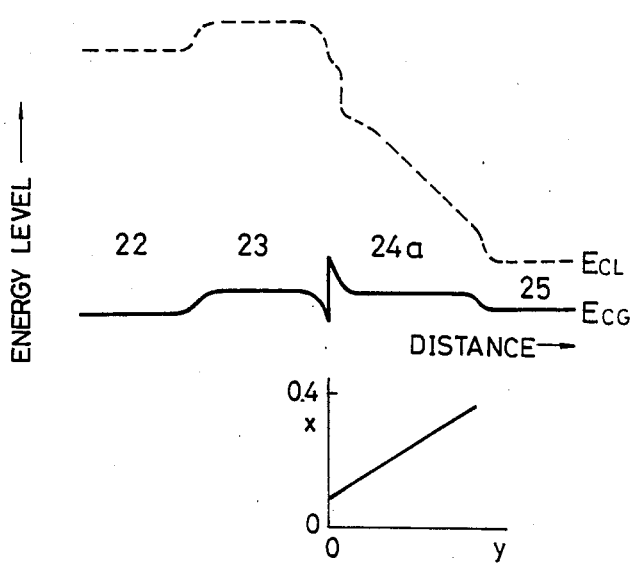
FIG.7B
FIG.7C
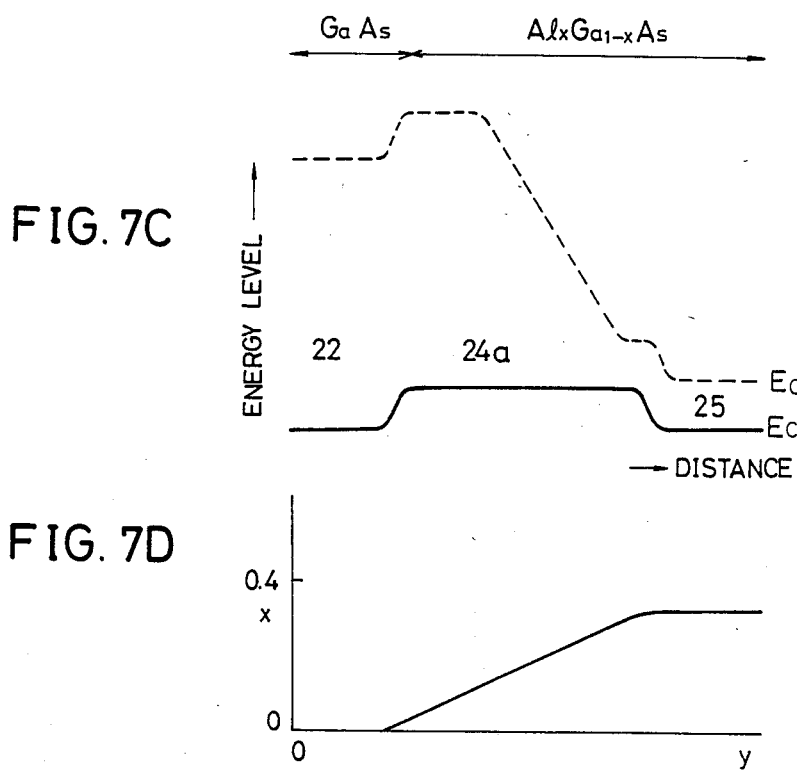
FIG.7D 4,914,489

CONSTANT CURRENT SEMICONDUCTOR DEVICE

This is a continuation of co-pending application Ser. No. 134,996 filed Dec. 18, 1987, abandoned.

BACKGROUND OF THE INVENTION

The present invention generally relates to a constant current semiconductor device, and in particular to a constant current semiconductor device which may be used as a current limiter such as a constant current diode.

As is well known, constant current limiters intended to prevent an excessive current from flowing in a circuit are widely used. Conventionally, a transistor is used as a constant current limiter. Recently, constant current limiters implemented with a semiconductor diode have been proposed. An example of these constant current limiters is disclosed in Zuleeg, IEEE, EDL-1 No. 11, pp. 234, 1980. The current limiter reported by Zuleeg is a constant current diode composed of a cathode electrode, an n+-type GaAs cathode side contact layer, an n-type GaAs active layer, an n+-type GaAs anode side contact layer and an anode electrode. A feature of this current limiter is that a thickness of the active layer is approximately 0.5 μm and is very thin. Therefore, electrons may move in the active layer without being affected by lattice vibration and impurity scattering. In other words, ballistic transport of electrons can be realized. When electrons are in the ballistic transport state, the speed of electrons can reach the highest speed which is allowable in semiconductors. As a result, in the case where the density of electrons in the ballistic transport state is the same as that in the collision dominated transport state, the current density in the ballistic transport state becomes highest. In other words, the ballistic transport of electrons make it possible to fabricate a current limiter having the same limited current with the smallest semiconductor area. In this case, almost all of a voltage applied to the current limiter is converted into a kinetic energy ε of electrons. For this reason, when the applied voltage is almost the same as $\Delta E_{GaAs}/e$ (where $\Delta E_{GaAs}$ is an intervalley energy difference at the active layer and e is an absolute value of charge of an electron), the intervalley transfer of electrons can be realized in which the electrons transfer from an Γ valley into an L valley of the active layer, and thus a current resulting from motion of the electrons is saturated. Hence, the current becomes constant at the above voltage. The applied voltage causing the current saturation is called a current saturating voltage.

As described above, the current saturating voltage depends on the $\Delta E_{GaAs}$, which is an inherent value of the GaAs active layer. Accordingly, a value of the current saturating voltage is fixed. In other words, it is impossible to select arbitrary values of the current saturating voltage. Generally, the current limiter is used for protection against excessive currents passing through circuits. Therefore, it is required that the current limiter should have an operational condition optimized for a circuit to which the current limiter is applied. This means that the conventional current limiter is useful for only limited applications.

Currently, active elements which are constituted by laminating compound semiconductor layers in one direction have been proposed and fabricated as electronic devices. Examples of these are a resonant-tunneling diode (generally called an RD), a resonant-tunneling hot electron transistor (generally called an RHET), a high electron mobility transistor (generally called an HEMT), a heterojunction bipolar transistor (generally called an HBT) and a resonant-tunneling bipolar transistor (generally called an RBT). As described above, these semiconductor devices are active elements constructed by growing compound semiconductor layers in one direction. In order to protect circuits formed by the RBT, RHET, HBT or HEMT against excessive currents, it is desired to build the current limiter having laminated compound semiconductor layers in one direction in the structure of the RBT, RHET, HBT or HEMT. In other words, the current limiter having a structure matching with the structure of the RBT, RHET, HBT or HEMT is desired.

SUMMARY OF THE INVENTION

Accordingly, it is a general object of the present invention to provide a novel and useful constant current semiconductor device in which the above-described disadvantages have been eliminated.

A more specific object of the present invention is to provide a constant current semiconductor device in which an arbitrary current saturating voltage can be selected over a wide voltage range.

Another object of the present invention is to provide a constant current semiconductor which may be suitably combined with semiconductor devices such as the RBT, RHET, HBT or HEMT.

The foregoing objects of the present invention are accomplished by providing a semiconductor device comprising a first semiconductor active layer and a second semiconductor active layer which is of a different material from the first active layer and forms a heterojunction together with the first active layer. An intervalley energy difference $\Delta E_1$ of the first active layer which is a difference in energy between bottoms of L and Γ valleys of the conduction band of the first active layer is different from an intervalley energy difference $\Delta E_2$ of the second active layer which is a difference in energy between bottoms of L and Γ valleys of the conduction band of the second active layer. A current saturating voltage at which a current passing through the semiconductor device is saturated is set so as to be equal to or greater than $\Delta E_2/e$, where e is an absolute value of charge of an electron.

Other objects and features of the present invention will become apparent from the following detailed description when read in conjunction with the attached drawings.

BRIEF DESCRIPTION OF THE DRAWINGS

FIG. 7A is an energy band diagram of another embodiment according to the present invention;

FIG. 7B is a graph for explaining variation of an Al content of an n-type AlGaAs active layer in FIG. 7A;

FIG. 7C is an energy band diagram of still another embodiment according to the present invention;

FIG. 7D is a graph for explaining variation of an Al content of an n-type AlGaAs active layer in FIG. 7C;

DETAILED DESCRIPTION

A description will first be given on the current limiter reported by Zuleeg briefly described previously.

Figure 1:
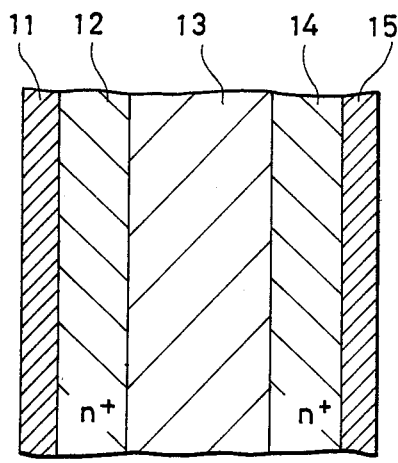
FIG. 1 is a cross sectional view of a conventional constant current semiconductor device.

FIG. 1 shows a cross section of an essential part of the current limiter. As illustrated in this figure, the current limiter comprises a cathode electrode 11, an n+-type GaAs cathode contact layer 12, an n-type GaAs layer 13, an n+-type GaAs anode contact layer 14 and an anode electrode 15. As described before, a thickness of the active layer 13 is approximately 0.5 μm and is very thin. Therefore, electrons may move in the active layer without being affected by lattice vibration and impurity scattering. In other words, ballistic transport of electrons can be realized. In this case, almost all of a voltage applied across the cathode and anode electrodes 11 and 15 are converted into the kinetic energy ε of the electrons. For this reason, when the applied voltage is almost the same as $\Delta E_{GaAs}/e$ (when $\Delta E_{GaAs}$ is an intervalley energy difference of the active layer and e is an absolute value of the charge of an electron), transition of electrons occurs in which the electrons move from an Γ valley into an L valley in the active layer, and a current resulting from motion of the electrons is saturated. Thus, the current becomes constant when the current saturating voltage is applied.

Figure 2A:
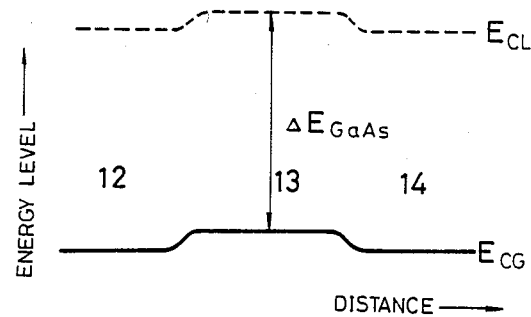
FIGS. 2A through 2C are energy band diagrams of the semiconductor device shown in FIG. 1.
Figure 2B:
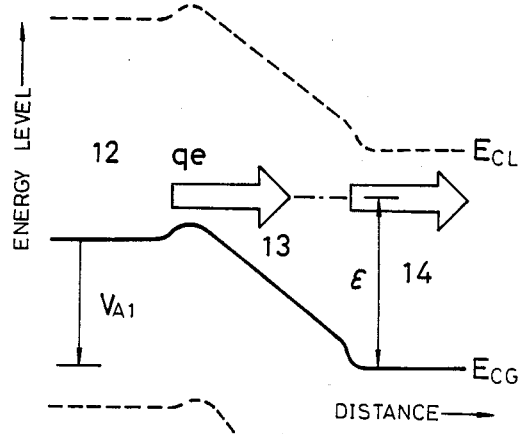
Figure 2C:
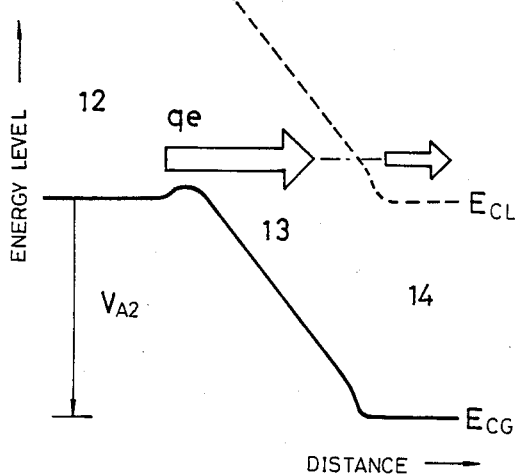

FIGS. 2A through 2C are respectively energy band diagrams for explaining the current limiter shown in FIG. 1. In these figures, the same reference symbols as those in FIG. 1 indicate the same parts or have the same meanings. Symbols $E_{CG}$ and $E_{CL}$ denote bottoms of Γ and L valleys of a conduction band, respectively. A symbol $\Delta E_{GaAs}$ denotes an intervalley energy difference at the GaAs layer 13. A character qe denotes an electron and ε denotes a kinetic energy of electron qe. Further, $V_{A1}$ and $V_{A2}$ denote anode voltages.

FIG. 2A is an energy band diagram with no voltage applied to the current limiter. In this case, the intervalley energy difference $\Delta E_{GaAs}$ is approximately 0.3 (eV). Electrons qe of a carrier exist in the Γ valley $E_{CG}$, which is the lowest energy level.

FIG. 2B is an energy band diagram with a voltage $V_{A1}$ applied to the current limiter. The voltage $V_{A1}$ satisfies the following inequality:

$$V_{A1} \leqq V_p$$

where $V_p$ is the current saturating voltage mentioned before. As clearly shown in this figure, the energy of of the electrons qe is increased as compared with the saturation shown in FIG. 2A. However, under the above voltage range, the energy of the electrons cannot exceed the intervalley energy difference $\Delta E_{GaAs}$. Therefore, all the electrons still remain in the Γ valley $E_{CG}$.

FIG. 2C is an energy band diagram with an voltage $V_{A2}$ applied to the current limiter. The voltage $V_{A2}$ satisfies the following inequality:

$$V_{A2} \geqq V_p.$$

In case, the electrons can go across the intervalley energy difference and enter into the L valley $E_{CL}$. An effective mass of each electron qe in the L valley is approximately 0.35 $m_0$ ($m_0$ is a best mass of the electron in a vacuum). On the other hand, an effective mass of each electron qe in the Γ valley is approximately 0.07 $m_0$. Therefore, the effective mass of the electron in the L valley $E_{CL}$ is five times the effective mass of the electron in the Γ valley $E_{CG}$. Moreover, the electrons in the L valley $E_{CL}$ are more frequently scattered than the electrons in the Γ valley $E_{CG}$. For these reasons, the velocity of the electrons abruptly decreases when the electrons enter into the L valley $E_{CL}$. Then, the electrons form an accumulation layer in the L valley $E_{CL}$, which causes the current saturation. That is, even when the voltage applied to the current limiter is increased, the applied voltage is consumed in the accumulation layer and an increase in current no longer occurs.

Figure 3:
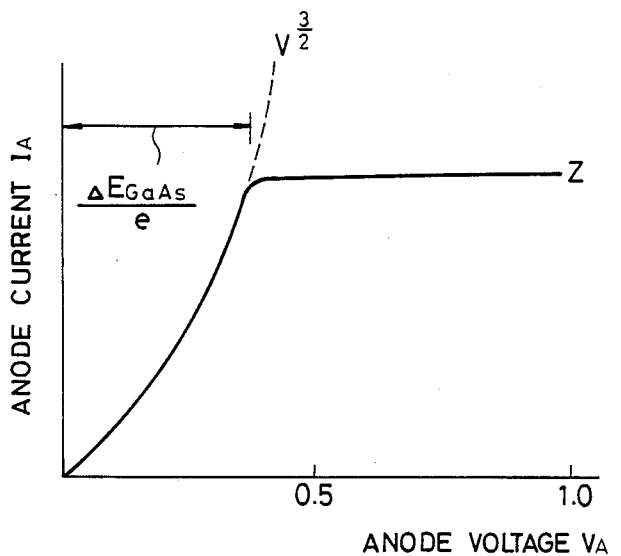
FIG. 3 is a graph showing an anode current versus anode voltage characteristic of the semiconductor device shown in FIG. 1.

FIG. 3 is a graph of an anode current $I_A$ versus an anode voltage $V_A$ for explaining occurrence of the current saturation in the current limiter shown in FIG. 1. In this figure, the same reference symbols as those in the previous figures represent the same parts or have the same meaning. The horizontal and vertical axes of the graph denote the anode voltage $V_A$ and the anode current $I_A$, respectively. A solid line indicated by a reference character Z is a characteristic line of the current limiter described before by referring to FIGS. 1 and 2A through 2C. A broken line shows a space charge limiting current characteristic in which the current is limited along the line $V^{3/2}$.

As discussed in the foregoing, the current saturating voltage of the conventional current limiter depends on the $\Delta E_{GaAs}$, which is an inherent value of the GaAs active layer 13. Therefore, a value of the current saturating voltage is fixed. In other words, it is impossible to select arbitrary values of the current saturating voltage. Generally, the current limiter is used for protection against excessive currents in circuits. Therefore, it is required that the current limiter should have an optimum condition for a circuit to which the current limiter is applied. This means that the conventional current limiter is useful for only limited applications.

Therefore, the present invention mainly intends to disclose techniques making it possible to arbitrarily select current saturating voltages $V_p$ of the current limiter over the wide voltage range. For this purpose, one of the essential features of the present invention is the presence of an active layer composed of different type semiconductor layers with a heterojunction capable of controlling an intervalley electron transition effect occurring in an active layer.

Figure 4:
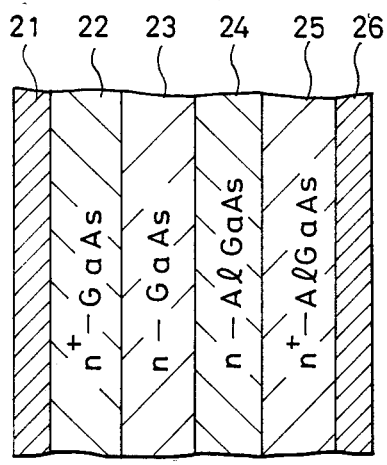
FIG. 4 is a cross sectional view of essential parts of an embodiment according to the present invention.

FIG. 4 shows a cross section of essential parts of an embodiment of a constant current semiconductor device according to the present invention. The constant current semiconductor device comprises a cathode electrode 21, an n+-type GaAs cathode side contact layer 22, an n-type GaAs active layer 23, an n-type AlGaAs active layer 24, an n+-type AlGaAs anode side contact layer 25 and an anode electrode 26. The heterojunction is formed at an interface between the n-GaAs active layer 23 and the n-AlGaAs active layer 24. The n-type GaAs active layer 23 is very thin, 0.5 ($\mu$m), for example, to ensure the ballistic transport of electrons. The layer may be grown by molecular beam epitaxy (MBE), for example.

Figure 5A:
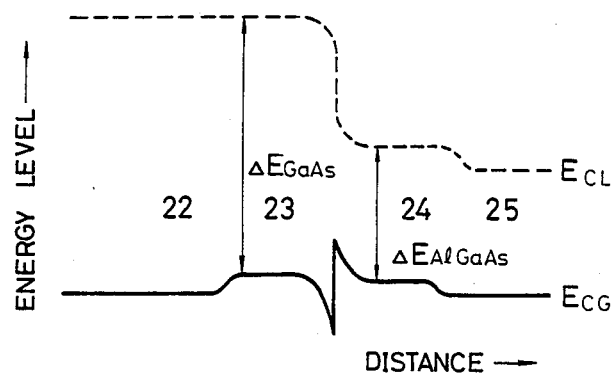
FIGS. 5A and 5B are energy band diagrams of the embodiment shown in FIG. 4.
Figure 5B:
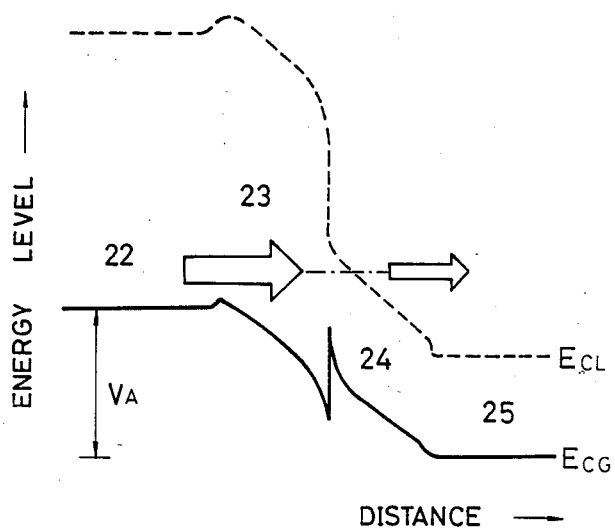

FIGS. 5A and 5B are respectively energy band diagrams for explaining operation of the configuration shown in FIG. 4. In FIGS. 5A and 5B, the same reference symbols as those in FIGS. 2A through 2C indicate the same parts or have the same meanings. In FIGS. 5A and 5B, a symbol $\Delta E_{AlGaAs}$ is an intervalley energy difference at the AlGaAs active layer 24, or a difference in energy between the L valley $E_{CL}$ and the $\Gamma$ valley $E_{CG}$, and a symbol $V_A$ is an anode voltage.

FIG. 5A is the energy band diagram obtainable when no voltage is applied to the semiconductor device, or the anode voltage $V_A=0$. FIG. 5B is the energy band diagram obtained when a voltage satisfying $V_A \geq \Delta E_{AlGaAs}/e$ is applied to the semiconductor device. It will be seen from FIG. 5A that the intervalley energy difference $\Delta E_{AlGaAs}$ at the AlGaAs layer 24 is smaller than the intervalley energy difference $\Delta E_{GaAs}$ at the GaAs layer 23. Therefore, even voltages lower than those in the case shown in FIG. 2C allow the intervalley transfer of electrons to occur. That is, the anode voltage $V_A$ ($\geq \Delta E_{AlGaAs}/e$) can transfer the electrons qe from the $\Gamma$ valley $E_{CG}$ to the L valley $E_{CL}$. The intervalley energy difference $\Delta E_{AlGaAs}$ at the n-AlGaAs active layer 24 is controllable by suitably selecting an Al content thereof. In the first embodiment, the Al content of the n-AlGaAs active layer 24 is equal to or less than approximately 0.4 and is uniform in its thickness direction.

Figure 6:
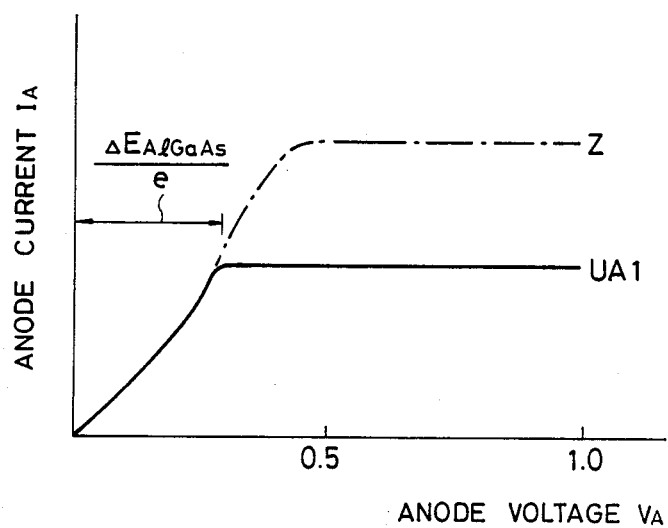
FIG. 6 is a graph showing an anode current versus anode voltage characteristic of the semiconductor device shown in FIG. 4.

FIG. 6 shows an anode current $I_A$ versus anode voltage $V_A$ characteristic of the configuration explained with reference to FIGS. 4, 5A and 5B. In FIG. 6, the same symbols as those in the previous figures indicate the same elements or have the same meanings. The horizontal and vertical axes of the graph shown in FIG. 6 denote the anode voltage $V_A$ and the anode current $I_A$. Also, a solid line UA1 is a characteristic line of the embodiment, and a broken line Z is the characteristic line of the configuration shown in FIG. 1.

It will be apparent from comparison between FIGS. 3 and 6 that according to the embodiment, the constant current characteristic is shown at a value of the voltage $V_A$ (about 0.3 (V)) lower than that in the conventional device.

Another embodiment of the present invention will be described below, by referring to FIGS. 7A and 7B.

As described before, the Al content of the n-AlGaAs active layer 24 shown in FIG. 4 is uniform over its thickness direction. On the other hand, one of the essential features of the embodiment shown in FIGS. 7A and 7B is in that the Al content of the n-AlGaAs is continuously varied or graded and thereby the intervalley energy difference $\Delta E_{AlGaAs}$ is varied in real space.

FIG. 7A is an energy band diagram of this embodiment and FIG. 7B is a graph showing a variation of the Al content of the n-AlGaAs. An n-type AlGaAs graded active layer 24a forms the heterojunction together with the n-GaAs layer 23. In FIG. 7B, the horizontal axis y shows a distance from the interface between the layers 23 and 24a towards the contact layer 25, and the vertical axis shows an Al content of the n-AlGaAs graded active layer 24a. The Al content of the n-AlGaAs graded active layer 24a gradually increases towards the n+-AlGaAs contact layer 25. Correspondingly, the energy of the L valley $E_{CL}$ of the conduction band of the n-AlGaAs graded active layer 24a gradually decreases with the increase of the Al content. As a result, the intervalley energy difference $\Delta E_{AlGaAs}$ at the n-AlGaAs graded active layer 24a decreases. As clearly shown in FIG. 7A, the intervalley energy difference $\Delta E_{AlGaAs}$ is smaller than the intervalley energy difference $\Delta E_{GaAs}$. Thus, even voltages lower than those in the case shown in FIG. 2C allow the intervalley transfer of electrons to take place.

It is preferable to grade the Al content in the range of approximately 0 to 0.4. When the Al content is approximately 0.4, the intervalley energy difference $\Delta E_{AlGaAs}$ become substantially equal to 0. As indicated above, the energy of the L valley $E_{CL}$ gradually becomes smaller depending on the continuous increase of the Al content. In place of this continuous bending of the L valley, it is also possible to use an abrupt energy bending of the L valley by abruptly varying the Al content.

In an embodiment of FIGS. 7C and 7D, there is no discontinuity like the heterojunction between the layers 23 and 24a in FIG. 7A, but the Al content changes from the cathode side contact layer 22 to the anode side contact layer 25 gradually so as not to have the discontinuity.

Figure 8:
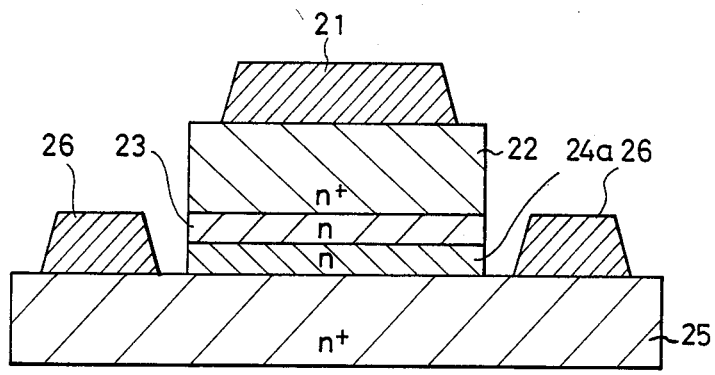
FIG. 8 is a cross sectional view fabricated on the basis of the features shown in FIGS. 7A and 7B.

FIG. 8 illustrates a cross section of an essential part of a constant current semiconductor device fabricated on the basis of the configuration shown in FIGS. 7A and 7B. The illustrated configuration may be formed with the following materials:

A. Cathode electrode 21:
Material: AuGe/Ni/Au
Thickness: 1000(Å)/200(Å)/500(Å)

B. Cathode side contact layer 22:
Material: GaAs
Thickness: 3000(Å)
Impurity: Si
Impurity density: $1 \times 10^{\sim}(cm^{-3})$ C. Active layer 23:
Material: GaAs
Thickness: 1000(Å)
Impurity: Si
Impurity density: $5 \times 10^{16}(cm^{-3})$ D. Graded active layer 24a:
Material: $Al_xGa_{1-x}As$
X: $0 \leq X \leq 0.4$ (graded)
Thickness: 1000(Å)
Impurity: Si
Impurity density: $5 \times 10^{16}(cm^{-3})$ E. Anode side contact layer 25:
Material: $Al_xGa_{1-x}As$
X: $0 < X < 0.4$ (uniform)
Thickness: 1000(Å)
Impurity: Si Impurity density: $5\times10^{18}(cm^{-3})$
F. Anode electrode 26
  Material: AuGe/Ni/Au
  Thickness: 1000(Å)/200(Å)/500(Å)

The thickness of the n-AlGaAs graded active layer 24a is preferably equal or less than 0.5 (μm). This is because the ballistic electron motion is necessary to effectively allow the intervalley transfer of electrons to take place. However, the thickness is not limited to the above range. The intervalley transfer of electrons depends on not only the thickness of the active layer but also the voltage applied to device, if electrons are not in the ballistic transport state but in the general collision dominated transport state. That is, the thicker the thickness of the active layer, the higher the voltage is needed. Thus, the intervalley transfer of electrons may take place by application of higher voltages, even when the thickness of the active layer 24a is more than 0.5 (μm).

Figure 9:
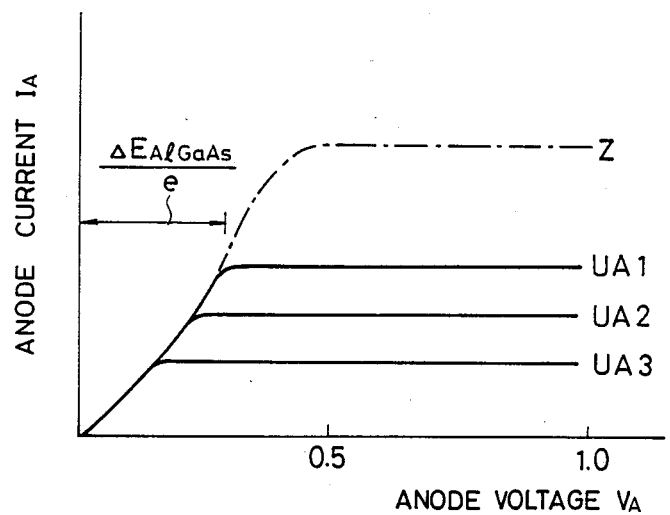
FIG. 9 is a graph showing anode current versus anode voltage characteristics of the semiconductor device shown in FIG. 8.

FIG. 9 is a graph of anode current $I_A$ versus anode voltage $V_A$ characteristics of the embodiment explained with reference to FIGS. 7A, 7B and 8. In FIG. 9, the same reference symbols as those in the previous figures indicate the same parts or have the same meanings. The horizontal and vertical axes of the graph of FIG. 9 represent the anode voltage $V_A$ and the anode current $I_A$, respectively. Lines UA2 and UA3 are characteristic lines of the diodes with different Al contents x. It will be seen from FIG. 9 that current saturating voltages depend on the Al content x.

A description will be given on still another embodiment according to the present invention.

The embodiments explained in the foregoing use the heterojunction of a GaAs/AlGaAs bilayer, which makes it possible to produce the current saturating voltages $V_p$ corresponding to constant currents UA1, UA2 and UA3 lower than the constant current Z in the conventional semiconductor device. However, according to the present invention, it is also possible to produce current saturating voltages $V_p$ corresponding to currents higher than the constant current Z.

Figure 10:
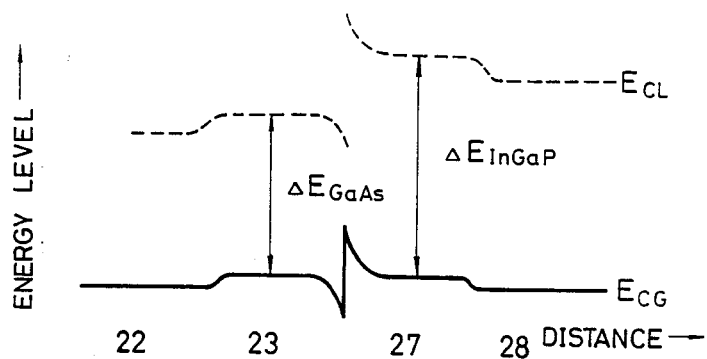
FIG. 10 is an energy band diagram of still another embodiment according to the present invention.

FIG. 10 is an energy band diagram of an example which uses the heterojunction of a GaAs/InGaP bilayer. In FIG. 10, the same reference symbols as those in the previous figures represent the same parts or have the same meanings. The constant current semiconductor device of this embodiment comprises the heterojunction composed of the n-GaAs active layer 23 and an n-InGaP active layer 27. An n+-InGaP anode side contact layer 28 is deposited on a surface of the InGaP active layer 27 opposing interface of the heterojunction. As clearly shown, an intervalley energy difference $E_{InGaP}$ of the active layer 27 is larger than the intervalley energy difference $\Delta E_{GaAs}$ of the active layer 23. A value of the intervalley energy difference $\Delta E_{InGaP}$ is controllable by an In content of the InGaP layer.

Figure 11:
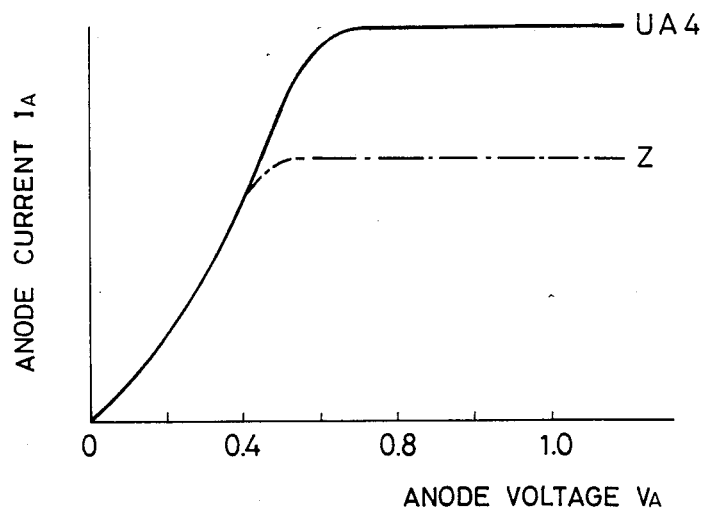
FIG. 11 is a graph showing an anode current versus anode voltage characteristic of the embodiment shown in FIG. 10 together with the anode current versus anode voltage characteristic of the conventional semiconductor device.

The following parameters apply for the layers 27 and 28 of the embodiment in FIG. 10:
A. Active layer 27:
  Material: InGaP
  Thickness: 1000(Å)
  Impurity: Si
  Impurity density: $5\times10^{16}(cm^{-3})$
B. Contact layer 28:
  Material: InGaP
  Thickness: 1000(Å)
  Impurity: Si
  Impurity density: $5\times10^{18}(cm^{-3})$ FIG. 11 is a graph of an anode current $I_A$ versus anode voltage $V_A$ characteristic of the embodiment shown in FIG. 10. In FIG. 11, the same reference symbols as those in the previous figures represent the same parts or the same meanings. The horizontal and vertical axes of the graph of FIG. 11 represent the anode voltage $V_A$ and the anode current $I_A$, respectively. As clearly seen, this embodiment shows a constant current characteristic UA4 at an anode voltage higher than that in the conventional device.

As indicated before, the present invention can be fabricated together with the RBT, RHET, HBT or HEMT.

Figure 12A:
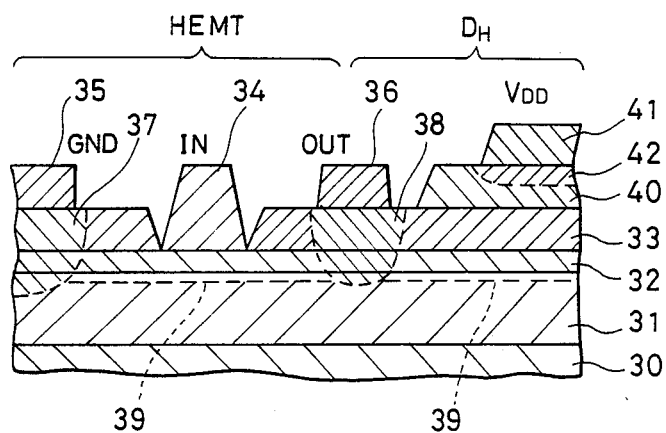
FIG. 12A is a cross sectional view of a semiconductor device in which the constant current semiconductor device and the conventional HEMT are formed on a common substrate.
Figure 12B:
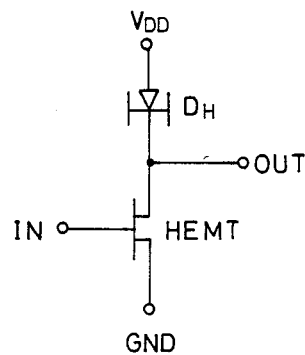
FIG. 12B is a circuit diagram of the semiconductor device shown in FIG. 12A.

FIG. 12A shows a cross section of an essential part of a semiconductor device in which the constant current semiconductor device of the present invention and the HEMT are grown on the common substrate, and FIG. 12B is a circuit diagram of the device in FIG. 12A.

A structure shown in FIG. 12A may be made by successively growing layers on a substrate and then selectively etching parts of layers. In FIG. 12A, undoped GaAs layer 31 is deposited on a top surface of a semiinsulating GaAs substrate 30. An n+-AlGaAs layer 32 is grown on a top surface of the GaAs layer 31. An n+-GaAs layer 33 is deposited on a top surface of the the n+-AlGaAs layer 32. A gate electrode 34 of an HEMT is also deposited on the top surface of the n+-AlGaAs layer 32. The gate electrode 34 may be made of an Al layer, for example. A source electrode 35 and a drain electrode 36 are deposited on a top surface of the n+-GaAs layer 33. Each of the electrodes may be made of an AuGe/Ni/Au layer. Under the electrodes 35 and 36, there are formed alloyed layers 37 and 38. A structure thus formed is the HEMT. A two dimensional electron gas layer (generally referred to as a 2DEG) is indicated by a reference numeral 39.

On a top of the n+-GaAs layer 33, there is deposited an n+-AlGaAs layer 40. An anode electrode 41 of a constant current diode $D_H$ is deposited on a top surface of the n+-AlGaAs layer 40. A thickness of the n+-AlGaAs layer 40 is preferably approximately 0.5 (μm). An alloyed layer 42 is formed under the electrode 41. The electrode may be made of an AuGe/Ni/Au layer. A heterojunction is formed between the n+-GaAs layer 33 and the n+-AlGaAs layer 40. This heterojunction is different from the heterojunction shown in FIG. 4 in that the latter is formed between the n-GaAs layer 23 and the n-AlGaAs layer 24. This means that even if the interface area of the heterojunction is doped with a higher impurity density (n+) as in the interface area of the layers 33 and 40, it is possible to satisfy the condition of $\Delta E_{AlGaAs} \leq \Delta E_{GaAs}$ as in the case shown in FIG. 5. Of course, the structure shown in FIG. 4 may be used in place of the layers 33 and 34. Further, it should be noted that the cathode of the diode $D_H$ and the drain of the HEMT is commonly used.

The present invention is not limited to the embodiments described before, but many variations and modifications may be made without departing from the scope of the present invention.

What is claimed is:

1. A constant current semiconductor device supplied with first and second potentials, comprising:
  a first semiconductor active layer which serves as a cathode and which is supplied with the first potential; and
  a second semiconductor active layer which serves as an anode, which is supplied with the second potential, and which is of a different material from said first semiconductor active layer, and forming a heterojunction together with said first semiconductor active layer, the first potential being a negative potential with respect to the second potential;

an intervalley energy difference $\Delta E_1$ of said first semiconductor active layer which is a difference in energy between bottoms of L and $\Gamma$ valleys of the conduction band of said first semiconductor active layer, being larger than an intervalley energy difference $\Delta E_2$ of said second semiconductor active layer which is a difference in energy between bottoms of L and $\Gamma$ valleys of the conduction band of said second semiconductor active layer, a current saturating voltage at which a current passing through said constant current semiconductor device is saturated, is set so as to be equal to or greater than $\Delta E_2/e$, where e is an absolute value of charge of an electron.

2. A constant current semiconductor device as claimed in claim 1, wherein said first semiconductor active layer is an n-GaAs layer and said second semiconductor active layer is an n-AlGaAs layer.

3. A constant current semiconductor device as claimed in claim 2, wherein the Al content of said n-AlGaAs is selected so as to satisfy a condition that the intervalley energy difference $\Delta E_2$ of said second semiconductor active layer is smaller than the intervalley energy difference $\Delta E_1$ of said first semiconductor active layer.

4. A constant current semiconductor device as claimed in claim 2, wherein the Al content of said n-AlGaAs layer is constant within said second semiconductor active layer and is in a range of 0.0 to 0.4.

5. A constant current semiconductor device as claimed in claim 2, wherein a thickness of said n-AlGaAs layer of said second semiconductor active layer is equal to or less than 0.5 ($\mu$m).

6. A constant current semiconductor device as claimed in claim 2, wherein the Al content of said n-AlGaAs layer is graded so as to increase with an increase in distance from an interface of said heterojunction to said n-AlGaAs layer of said second semiconductor active layer.

7. A constant current semiconductor device as claimed in claim 6, wherein the Al content of said n-AlGaAs layer is graded within a range of 0.0 to 0.4.

8. A constant current semiconductor device as claimed in claim 2, wherein said n-GaAs layer has opposed first and second surfaces, wherein said n-AlGaAs layer has first and second surfaces, wherein the first surfaces of said n-GaAs and n-AlGaAs layers are at the heterojunction, and wherein said device further comprises:

an n$^+$-GaAs layer deposited on the second surface of said n-GaAs layer and having a surface;
a first electrode deposited on the surface of said n$^+$-GaAs layer opposing said n-GaAs layer;
an n$^+$-AlGaAs layer deposited on the second surface of said n-AlGaAs layer and having a surface; and
a second electrode deposited on the surface of said n$^+$-AlGaAs layer opposing said n-AlGaAs layer.

9. A constant current semiconductor device as claimed in claim 1, wherein said first semiconductor active layer is an n$^+$-GaAs layer and said second semiconductor active layer is an n$^+$-AlGaAs active layer.

10. A constant current semiconductor device as claimed in claim 1, wherein said first semiconductor active layer is an n-GaAs layer and said second semiconductor active layer is an n-InGaP layer.

11. A constant current semiconductor device as claimed in claim 10, wherein said n-GaAs layer has opposed first and second surfaces, wherein said n-InGaP layer has opposed first and second surfaces, wherein the first surface of said n-GaAs and n-InGaP layers are at the heterojunction, and wherein said device further comprises:

an n$^+$-GaAs layer deposited on the second surface of said n-GaAs layer and having a surface;
a first electrode deposited on the surface of said n$^+$-GaAs layer opposing said n-GaAs layer;
an n$^+$-InGaP layer deposited on the second surface of said n-InGaP layer and having a surface; and
a second electrode deposited on the surface of said n$^+$-InGaP layer opposing said n-InGaP layer.

12. A constant current semiconductor device adapted to a current limiter for a transistor having gate, drain and source electrodes, comprising:

a semi-insulating gallium arsenide (GaAs) substrate having a top surface;
an undoped GaAs layer deposited on the top surface of said semi-insulating GaAs substrate and having a top surface;
an aluminum gallium arsenide (AlGaAs) layer deposited on the top surface of said undoped GaAs layer and having a top surface, the gate electrode of the transistor being deposited on said AlGaAs layer;
a GaAs active layer deposited on the top surface of said AlGaAs layer and having a top surface, the drain and source electrodes of the transistor being deposited on said GaAs active layer;
an AlGaAs active layer deposited on the top surface of said GaAs active layer; and
an anode electrode deposited on said AlGaAs active layer, the drain electrode of the transistor also forming a cathode electrode of said semiconductor device.

13. A constant current semiconductor device as claimed in claim 12, wherein said AlGaAs layer is made of n$^+$-AlGaAs, and said GaAs layer is made of n$^+$-GaAs.

14. A constant current semiconductor device as claimed in claim 12, wherein said AlGaAs layer is made of n-AlGaAs and said GaAs layer is made of n-GaAs.

15. A constant current semiconductor device supplied with first and second potentials, comprising:

a first semiconductor active layer which serves as a cathode, and which is supplied with the first potential;
a second semiconductor active layer which serves as an anode, which is supplied with the second potential, and which is of a different material from said first semiconductor active layer, and forming a heterojunction together with said first semiconductor active layer, the first potential being a negative potential with respect to the second potential;
an intervalley energy difference $\Delta E_1$ of said first semiconductor active layer which is a difference in energy between bottoms of L and $\Gamma$ valleys of the conduction band of said first semiconductor active layer, being smaller than an intervalley energy difference $\Delta E_2$ of said second semiconductor active layer which is a difference in energy between the bottoms of L and $\Gamma$ valleys of the conduction band of said second semiconductor active layer, a current saturating voltage at which a current passing through said constant current semiconductor device is saturated, is set so as to be equal to or greater than $\Delta E_2/e$, where e is an absolute value of charge of an electron;

the level of the bottom of the Γ valley having a minimum value on the first semiconductor active layer side of said heterojunction, and having a maximum value on the second semiconductor active layer side of said heterojunction.

* * * * *

UNITED STATES PATENT AND TRADEMARK OFFICE
CERTIFICATE OF CORRECTION

PATENT NO. : 4,914,489
DATED : APRIL 3, 1990
INVENTOR(S) : YUJI AWANO

It is certified that error appears in the above-identified patent and that said Letters Patent is hereby corrected as shown below:

FRONT PAGE, Col. 2, line 6, "No. 25126" should be --25/26--.

Col. 3, line 46, "(when" should be --(where--.

Col. 4, line 8, "of" (second occurrence) should be deleted;
line 20, "In case," should be --In this case,--.

Col. 6, line 52, "$1 \times 10_{18}\ (cm^{-3})$" should be --$1 \times 10^{18} (cm^{-3})$--;
line 66, "<" (both occurrences) should be --$\leq$--.

Col. 7, line 2, "26" should be --26:--.

Col. 8, line 23, "semiinsulating" should be --semi-insulating--.

Col. 9, line 68, "1," should be --15,--.

Signed and Sealed this

Eleventh Day of June, 1991

*Attest:*

HARRY F. MANBECK, JR.

*Attesting Officer*   *Commissioner of Patents and Trademarks*